United States Patent [19]

Bush

[11] Patent Number: 5,263,185

[45] Date of Patent: Nov. 16, 1993

[54] AM DISTORTION MEASUREMENT METHOD AND APPARATUS USABLE ON ACTIVE AUDIO CARRIERS

[75] Inventor: Terry W. Bush, Greenwood, Ind.

[73] Assignee: Trilithic, Inc., Indianapolis, Ind.

[21] Appl. No.: 624,542

[22] Filed: Dec. 10, 1990

[51] Int. Cl.$^5$ ............................................. H04B 17/00
[52] U.S. Cl. ................................. 455/226.3; 455/67.3; 358/139; 324/613
[58] Field of Search .................. 455/67, 226, 256, 315, 455/339, 67.3, 67.7, 226.3, 226.4; 358/139; 324/612, 613, 620, 623; 307/351

[56] References Cited

U.S. PATENT DOCUMENTS

| | | | |
|---|---|---|---|
| 3,716,864 | 2/1973 | Stover | 455/295 |
| 4,308,497 | 12/1981 | Rodgers | 324/103 P |
| 4,415,852 | 11/1983 | Ashley et al. | 324/613 |
| 4,685,065 | 8/1987 | Braun et al. | 358/139 |
| 4,751,455 | 6/1988 | Ayres | 324/613 |
| 4,760,448 | 7/1988 | Wittrock et al. | 358/139 |

OTHER PUBLICATIONS

Sencore Product Brochure, "The FS74A Channelizer Sr. TM", Form 4245.
Sadelco Inc. Model 600B Digital Signal Level Meter Preliminary Specification Sep. 12, 1990, 2 pages.

Primary Examiner—Reinhard J. Eisenzopf
Assistant Examiner—Edward Urban
Attorney, Agent, or Firm—Woodard, Emhardt, Naughton Moriarty & McNett

[57] ABSTRACT

A test instrument for measuring hum and other AM distortion components on active audio carriers such as in a cable television distribution system. The instrument has an RF tuner capable of tuning to the audio carrier frequency for a selected channel, and also has three IF amplifier stages including a third stage with a 280 KHz bandwidth, which is sufficiently narrow to reject the video signal when the tuner is tuned to the audio carrier frequency. An AM detector detects amplitude variations in the FM signal, and the AM detector output signal is filtered alternatively in a 400 Hz lowpass filter or a bandpass filter to facilitate measurement of the level of different forms of distortion. The center frequency of the bandpass filter is capable of being set to the AC power line frequency or twice the line frequency. The bandwidth of the bandpass filter is limited to about 2-3 Hz to minimize the effect of amplitude variations other than hum in the FM audio signal. The filter output signal is rectified and filtered in an AC signal level detector, producing a signal representative of the hum level for display on an analog meter.

14 Claims, 1 Drawing Sheet

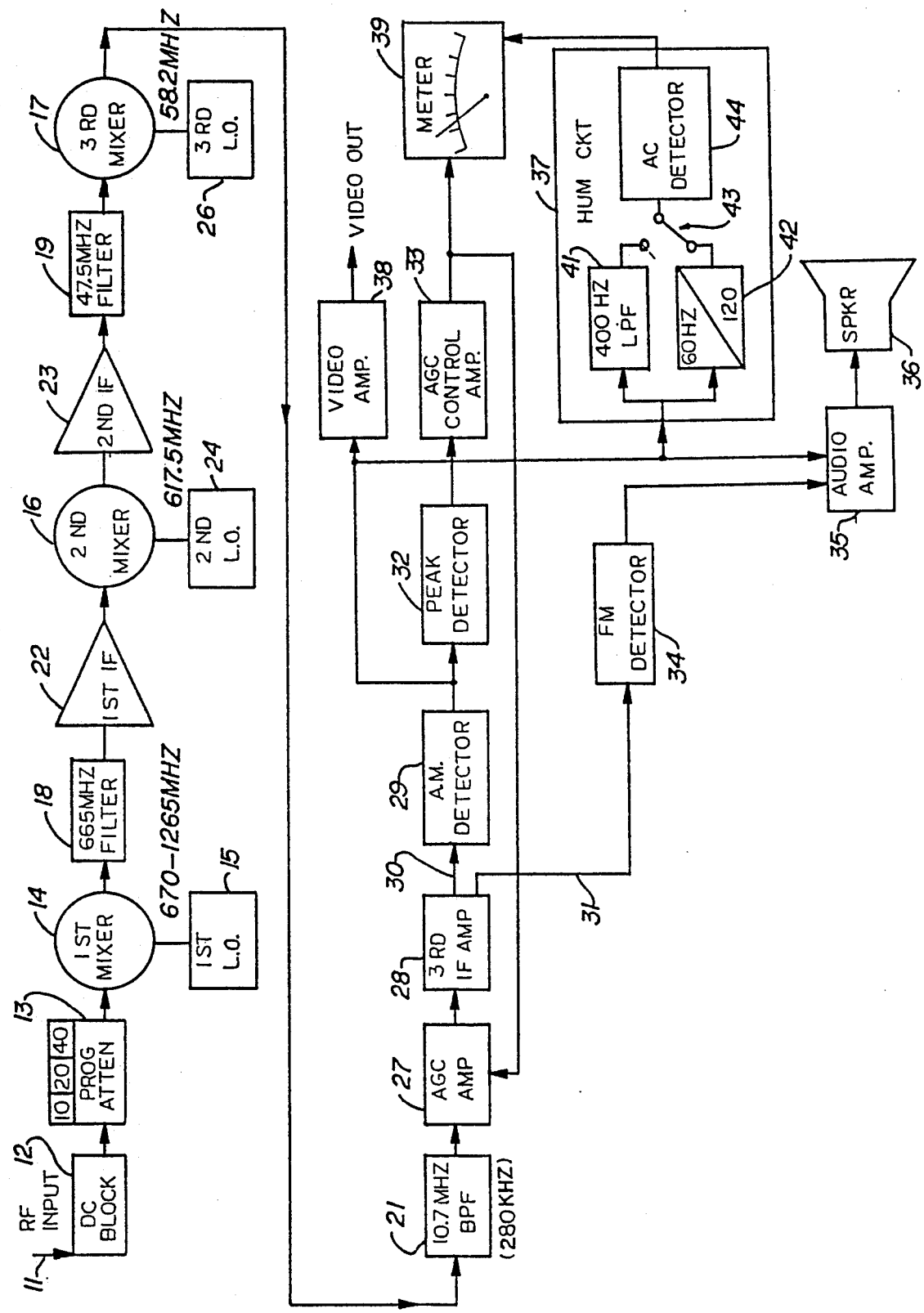

AM DISTORTION MEASUREMENT METHOD AND APPARATUS USABLE ON ACTIVE AUDIO CARRIERS

BACKGROUND OF THE INVENTION

1. Field of the Invention

This invention relates generally to test instrumentation for television systems, and more particularly to instrumentation for measuring hum and other forms of AM distortion in television signals.

2. Description of the Prior Art

Hum and other forms of AM distortion are introduced into television signals from a variety of sources, such as power supplies, amplifiers and other sources within cable television distribution systems, as well as AC power sources near components of television systems. Composite hum can be measured with existing meters. One technique, used in the cable television industry, involves transmitting an unmodulated test carrier on an unused cable channel and then measuring amplitude variations in the signal on that channel at some remote point in the system. A shortcoming of this technique is that many cable service providers use all available channels for commercial programming and do not welcome interruption of service on any channel for test purposes.

An instrument designed for hum testing on channels in use is described in U.S. Pat. No. 4,760,448. This instrument samples the high and low peak amplitudes of horizontal sync pulses in a composite television signal and determines the percentage of hum in the RF input signal on the basis of the difference between the maximum and minimum sampled levels. The disclosed sampling technique requires circuitry capable of separating the horizontal and vertical sync pulses from the detected composite video signal, generating a train of sampling pulses in sync with the horizontal sync pulses, and then interrupting the pulse train during the vertical blanking interval so as to prevent sampling of the detected video signal during that interval. Sampling must be inhibited during the vertical blanking interval because control signals are transmitted then at varying amplitude levels which would otherwise cause the hum measurements to be inaccurate. While such an instrument with its selective sampling circuitry may be adequate in certain applications, it does not operate properly on channels on which the signal is scrambled by means of sync suppression, which is the most common scrambling method used in the cable television industry.

Thus, there remains a need for a versatile method and apparatus for measuring AM distortion on active channels in an RF distribution system. A further need exists for enhanced system troubleshooting through tracking of different distortion components.

SUMMARY OF THE INVENTION

Described briefly, according to a typical embodiment of the present invention, hum and other AM distortion components are measured on an active audio carrier, which is frequency modulated and therefore ordinarily characterized by constant amplitude. An AM detector is employed to detect amplitude variations in the FM signal, and the level of such amplitude variations is determined.

One aspect of the present invention involves differentiating between different forms of AM distortion in the FM audio signal. These could include, but are not limited to, 60 Hz and 120 Hz hum or other low-frequency components. Another aspect involves separation of the FM audio signal from the AM video signal to prevent the latter from affecting the hum measurement.

A further aspect of the invention provides the ability to track different forms of AM distortion in detected amplitude variations. A meter according to this aspect of the invention includes a bandpass filter and a lowpass filter each having an input coupled to an AM detector. The center frequency of the bandpass filter is switchable between an AC power line frequency and the first harmonic of said AC power line frequency, e.g., between 60 Hz and 120 Hz for applications in the United States. The lowpass filter has a cutoff frequency or −3 dB point of approximately 400 Hz, as in a conventional composite hum measurement. The meter includes circuitry for switching between the bandpass filter and the lowpass filter and between the alternative center frequencies of the bandpass filter.

It is a general object of the present invention to provide an improved method and apparatus for measuring AM distortion in television signals.

Another object of the invention is to enable measurement of AM distortion on active channels including scrambled channels.

Yet another object of the present invention is to facilitate fast, efficient troubleshooting of RF distribution systems.

These and other objects and advantages of the invention will become more apparent upon reading the following detailed description of the preferred embodiment in conjunction with the accompanying drawing.

BRIEF DESCRIPTION OF THE DRAWINGS

The single FIGURE of drawing is a block diagram showing the application of the signal to the hum circuit according to a typical embodiment of the present invention.

DESCRIPTION OF THE PREFERRED EMBODIMENT

For the purposes of promoting an understanding of the principles of the invention, reference will now be made to the embodiment illustrated in the drawing and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to the drawing in detail, the meter is connected to the cable trunk by an RF input line 11 leading to DC block 12 which protects the unit from DC and 60 Hz AC at the RF input. A programmable attenuator 13 connected to DC block 12 provides attenuation in 10 dB steps from 0–70 dB, through selective combination of 10 dB, 20 dB and 40 dB attenuation bits or cells under control of a microprocessor (not shown), which, as will be described, also controls the operation of other circuits in the test instrument. The meter includes a tuner having a double-balanced first mixer 14 and a first local oscillator (L.O.) which includes a phase-locked-loop (PLL) frequency synthesizer built around two varactor-tuned oscillators, one covering 670–881 MHz and the other covering 881–1265 MHz.

The combined tuning range of the 670-1265 MHz gives the meter a frequency range of 5-600 MHz. Mixer products other than those at the first IF frequency of 665 MHz are rejected by a 665 MHz dual helical filter 18 which preferably has a bandwidth of 15 MHz.

The meter has three video IF amplifier stages which include first, second and third IF amplifiers 22, 23 and 28, second and third mixers 16 and 17, second and third local oscillators 24 and 26, and associated bandpass filters 19 and 21 as well as an automatic gain control (AGC) amplifier 27. The first, second and third IF amplifiers provide approximately 20, 30 and 60 dB of gain, respectively.

Second L.O. 24 is a crystal-controlled oscillator operating at 617.5 MHz, and includes a surface acoustic wave (SAW) resonator as a frequency control element. Second mixer 16 combines the 665 MHz signal from the first IF amplifier with a 617.5 MHz signal from second local oscillator 24 to produce the second IF signal at 47.5 MHz. Unwanted frequency components such as image frequencies are filtered out by bandpass filter 19, which has a center frequency of 47.5 MHz and a bandwidth of about 4.5 MHz. Third mixer 17, another double-balanced mixer, converts the second IF signal to a third IF signal at 10.7 MHz in response to a fixed frequency input of 58.2 MHz from third local oscillator 26.

Bandpass filter 21 is a ceramic filter with a center frequency of 10.7 MHz and a bandwidth of 280 KHz. It effectively passes all audio information on a selected channel when the first local oscillator is adjusted so as to tune the meter to the selected channel's audio carrier frequency. For example, for a hum test on Channel 2, the meter is tuned to 59.75 MHz, the audio carrier frequency for Channel 2, by tuning first L.O. 15 to 724.75 MHz. The corresponding video signal on Channel 2 is substantially eliminated due to the narrow bandwidth of filter 21. Alternatively, the video signal may be selected by tuning the meter to the video carrier frequency of the selected channel, e.g., 55.25 MHz for Channel 2, in which case the corresponding audio signal is substantially eliminated. Thus, the meter allows selection of either the audio signal or the video signal on any particular channel of interest. The 280 KHz bandwidth of filter 21 is wide enough to pass sufficient video information to allow measurement of video carrier amplitude. Color information and fine grain resolution are substantially lost in the process, but the residual video signal is still useful to some extent for monitoring depth of modulation, for example.

AGC amplifier 27 is part of an AGC system which stabilizes the third IF amplifier input signal against RF input signal variations. The gain of AGC amplifier 27 varies in accordance with an AGC voltage supplied as a feedback signal from AGC control amplifier 33. Third IF amplifier 28 has complementary outputs 30 and 31 which are connected to AM detector 29 and FM detector 34, respectively. AM detector 29 detects the envelope of the incoming signal from the third IF amplifier and supplies it to a peak detector 32 and also to an audio amplifier 35, hum circuit 37 and video amplifier 38. Peak detector 32 detects the peak level of the demodulated signal from AM detector 29, i.e., the level of the sync pulses. In order to effectively follow vertical sync pulses and not be affected by horizontal sync pulses, the amplitude of which may vary due to scrambling, the peak detector is provided with a time constant which is very long relative to the timing of horizontal sync pulses, preferably at least an order of magnitude greater than 16 milliseconds. AGC control amplifier 33 generates the AGC voltage as a function of the difference between the peak level of the signal from peak detector 32 and an internal reference voltage. The AGC voltage is fed back to AGC amplifier 27 for gain control, as described above, and is also supplied to meter circuit 39 for display of the video carrier level. Meter circuit 39 includes an analog meter movement and meter drive circuitry including a linear-to-log converter which produces an output logarithmically related to the input from the AGC control amplifier.

Hum circuit 37 includes a 400 Hz lowpass filter 41 and a switched capacitor filter 42, both connected to the output of AM detector 29 and selectively connected by an electronic switch 43 to the input of an AC detector 44, the output of which is coupled to meter 39 for display of percent hum. Filter 42 includes two crystal-controlled bandpass filters, one tuned to 60 Hz and the other to 120 Hz, and preferably incorporates a Motorola MF10 integrated circuit. Selection of a filter within filter 42 and selection between filters 41 and 42 is performed under microprocessor control in response to keyboard entry of the desired mode of operation. The bandwidth of the 60 Hz and 120 Hz filters is preferably limited to about 2-3 Hz to minimize the effect of amplitude variations other than hum in the FM signal, particularly amplitude variations caused by slope detection in the third IF stage of the meter. The audio carrier is not amplitude modulated at the transmitter, but amplitude variations are produced by the third IF stage because its frequency response is not perfectly uniform for all frequencies in the incoming FM signal. Hum can be separated from such amplitude variations by providing filter 42 with a narrow bandwidth as described above.

AC detector 44 includes a precision rectifier and an output buffer amplifier, and its gain is set, preferably with a calibration pot, so as to produce a full-scale meter deflection, corresponding to 5% hum, in response to a calibration signal of 5% modulation. A ratio circuit is not needed to obtain percent hum with the present invention because the AGC system holds the output of the third IF amplifier substantially constant, such that the hum level as detected by the hum circuit is automatically normalized with respect to carrier level.

Lowpass filter 41 is switched into the hum circuit for a composite hum measurement. In this mode, meter 39 shows the vector sum of all baseband frequency components up to 400 Hz. Filter 42 is switched into the hum circuit to narrow in on hum problems. It enables measurement of hum at the line frequency or twice the line frequency, depending upon the frequency of interest. If the hum at 60 Hz is significant, it may be an indication of a failing rectifier or power line interference, for example. Significant hum components at 120 Hz may be an indication that a power supply filter is failing.

FM detector 34 demodulates the FM signal supplied from the third IF amplifier when the meter is tuned to the audio carrier of an active channel, and the resulting audio signal is amplified in audio amplifier 35 and supplied to speaker 36. The meter thus Provides audible confirmation that the meter is currently tuned to an audio carrier. The audio amplifier also receives the output from AM detector 29 as an input signal. When the meter is tuned to a video carrier of an active channel, the demodulated video signal from AM detector drives the speaker, resulting in "sync buzz" which serves as an audible indication of the presence of the video signal. Video amplifier 38 amplifies the demodulated video signal and provides it as a video output for application to an oscilloscope, a monitor or other external device.

As will be appreciated from the foregoing description, the present invention is particularly useful in the cable television industry because it enables measurement of hum in cable distribution systems without inserting an unmodulated test carrier or any other test signal and thus without disturbing subscribers by interruption of normal service as would result from disconnecting a channel for such purposes. Hum measurements can be performed even on channels scrambled by horizontal sync suppression. The invention also enables achieving such results with test equipment costing significantly less than a test signal generator which could cost in the order of $6,000 to $10,000 for such an application. A product incorporating the above-described meter circuitry, along with additional circuitry and accessories which are not a part of the present invention, is known as the SP-1700 Digital Signal Level Meter marketed by Trilithic, Inc., 9202 East 33rd Street, Indianapolis, Indiana 46236.

In its preferred embodiment, the present invention gives the user three methods to track hum-related problems, and thereby significantly enhances system troubleshooting. Measurements can be made using the traditional 400 Hz lowpass method or either of two bandpass methods specific to line frequency multiples. Hum testing at the line frequency multiples enables easy tracking of hum sources such as defective passive devices and power supplies. Bandpass filters tuned to 60 and 120 Hz as described above are designed for use with a 60 Hz line frequency. In countries where the line frequency is nominally 50 Hz, the bandpass filters are tuned to 50 and 100 Hz but are otherwise the same as described above. The disclosed bandpass filter circuit may alternatively be tuned to any desired frequency for measurement of specific AM components.

While the invention has been illustrated and described in detail in the drawing and foregoing description, the same is to be considered as illustrative and not restrictive in character, it being understood that only the preferred embodiment has been shown and described and that all changes and modifications that come within the spirit of the invention are desired to be protected.

What is claimed is:

1. An apparatus for measuring Am distortion on a television channel carrying modulated audio and video signals including an FM audio signal, comprising:
    tuning means for tuning said apparatus to receive said FM audio signal;
    AM detector means coupled to said tuning means for detecting amplitude variations in said FM audio signal; and
    level detection means for determining the level of said detected amplitude variations in said FM audio signal,
    wherein said level detection means includes means for determining the level of said detected amplitude variations relative to the level of said FM audio signal,
    further comprising AGC circuit means for stabilizing the input signal to said AM detector means against variations in the level of said FM audio signal,
    wherein said level detection means further includes a bandpass filter having an input coupled to said AM detector, means for electronically tuning said bandpass filter alternatively to an AC power line frequency and to the first harmonic of said AC power line frequency, and an AC detector having an input coupled to said bandpass filter.

2. The apparatus of claim 1 wherein said level detection means further includes means for attenuating amplitude variations resulting from slope detection within said tuning means.

3. The apparatus of claim 2 wherein said tuning means includes means for converting said video and audio signals to an intermediate frequency, and tuned IF circuit means for rejecting said video signal when said apparatus is tuned to receive said FM audio signal.

4. The apparatus of claim 3 wherein said level detection means further includes a lowpass filter having an input coupled to said AM detector, said lowpass filter having a cutoff frequency of approximately 400 Hz, and switch means for alternatively coupling said bandpass filter and said lowpass filter to said AC detector.

5. An apparatus for measuring AM distortion on a television channel carrying modulated audio and video signals including an FM audio signal, comprising;
    turning means for tuning said apparatus to receive said FM audio signal;
    AM detector means coupled to said tuning means for detecting amplitude variations in said FM audio signal; and
    level detection means for determining the level of said detected amplitude variations in said FM audio signal,
    wherein said level detection means includes a bandpass filter having an input coupled to said AM detector, means for electronically tuning said bandpass filter alternatively to an AC power line frequency and to the first harmonic of said AC power line frequency, and an AC detector having an input coupled to said bandpass filter.

6. The apparatus of claim 5 wherein said level detection means further includes a lowpass filter having an input coupled to said AM detector, said lowpass filter having a cutoff frequency of approximately 400 Hz, and switch means for alternatively coupling said bandpass filter and said lowpass filter to said AC detector.

7. A method of measuring AM distortion on a television channel carrying modulated audio and video signals including an FM audio signal on an audio carrier frequency, comprising the steps;
    tuning to said audio carrier frequency to receive said FM audio signal;
    detecting amplitude variations in said FM audio signal with an AM detector; and
    determining the level of said detected amplitude variations in said FM audio signal,
    wherein said level-determining step includes determining the level of said detected amplitude variations relative to the level of said FM audio signal,
    further comprising the step of amplifying said FM audio signal with an AGC amplifier prior to detecting said amplitude variations.
    wherein said level-determining step is performed by filtering the output signal from said AM detector with a bandpass filter which is alternatively tunable to an AC power line frequency and to the first harmonic of said AC power line frequency, and by detecting the AC level of the bandpass filter output signal.

8. The method of claim 7 wherein said level-determining step further includes attenuating amplitude variations introduced during said tuning step.

9. The method of claim 8 wherein said tuning step includes converting said audio carrier frequency to an intermediate frequency and separating said FM audio signal from said video signal in a tuned IF circuit.

10. The method of claim 9 wherein said level-determining step is alternatively performed by filtering the output signal from said AM detector with a lowpass filter having a cutoff frequency of approximately 400 Hz, and by detecting the AC level of the lowpass filter output signal.

11. A method of measuring AM distortion on a television channel carrying modulated audio and video signals including an FM audio signal on an audio carrier frequency, comprising the steps:
    tuning to said audio carrier frequency to receive said FM audio signal;
    detecting amplitude variations in said FM audio signal with an AM detector; and
    determining the level of said detected amplitude variations in said FM audio signal.
    wherein said level-determining step is performed by filtering the output signal from said AM detector with a bandpass filter which is alternatively turnable to an AC power line frequency and to the first harmonic of said AC power line frequency, and by detecting the AC level of the bandpass filter output signal.

12. A method of measuring AM distortion on a television channel carrying modulated audio and video signals including an FM audio signal on an audio carrier frequency, comprising the steps:
    tuning to said audio carrier frequency to receive said FM audio signal;
    detecting amplitude variations in said FM audio signal with an AM detector; and
    determining the level of said detected amplitude variations in said FM audio signal,
    wherein said level-determining step includes determining the level of said detected amplitude variations relative to the level of said FM audio signal,
    wherein said level-determining step is alternatively performed by filtering the output signal from said AM detector with a lowpass filter having a cutoff frequency of approximately 400 Hz, and by detecting the AC level of the lowpass filter output signal.

13. An apparatus for measuring AM distortion on a television channel carrying a composite television signal including modulated audio and video carriers, comprising:
    tuning means for tuning said apparatus to said television channel;
    AM detector means coupled to said tuning means for detecting Am-distortion-related amplitude variations on one of said modulated carriers; and
    means for tracking different forms of AM distortion in said detected amplitude variations, said tracking means including a bandpass filter and a lowpass filter each having an input coupled to said AM detector, said bandpass filter having a center frequency which is switchable between an AC power line frequency and the first harmonic of said AC power line frequency, said lowpass filter having a cutoff frequency of approximately 400 Hz, said tracking means further including means for switching between said bandpass filter and said lowpass filter and between said alternative center frequencies of said bandpass filter; and
    means coupled to said switching means for determining AC signal level.

14. An apparatus for measuring AM distortion on a television channel carrying a composite television signal including modulated audio and video carriers, comprising:
    tuning means for tuning said apparatus to said television channel;
    AM detector means coupled to said tuning means for detecting Am-distortion-related amplitude variations on one of said modulated carriers; and
    means for tracking different forms of AM distortion in said detected amplitude variations, said tracking means including a narrowband bandpass filter having an input coupled to said AM detector, and means for varying the center frequency of said bandpass filter to isolate selected components of AM distortion; and
    means coupled to said varying means for determining AC signal level.

* * * * *

UNITED STATES PATENT AND TRADEMARK OFFICE
CERTIFICATE OF CORRECTION

PATENT NO. : 5,263,185
DATED : November 16, 1993
INVENTOR(S) : Terry W. Bush

It is certified that error appears in the above-identified patent and that said Letters Patent is hereby corrected as shown below:

In column 4, line 60, please change "Provides" to --provides--.
In column 5, line 48, please change "Am" to --AM--.
In column 6, line 61, please change the period to a comma.
In column 8, line 10, please change "Am" to --AM--.
In column 8, line 35, please change "Am" to --AM--.

Signed and Sealed this

Twenty-eighth Day of June, 1994

Attest:

BRUCE LEHMAN

Attesting Officer    Commissioner of Patents and Trademarks